(12) United States Patent
Wong et al.

(10) Patent No.: US 7,301,225 B2
(45) Date of Patent: Nov. 27, 2007

(54) MULTI-ROW LEAD FRAME

(75) Inventors: Fei Ying Wong, Hong Kong (HK); Wai Keung Ho, Hong Kong (HK); Ho Wang Wong, Hong Kong (HK)

(73) Assignee: Freescale Semiconductor, Inc., Austin, TX (US)

( * ) Notice: Subject to any disclaimer, the term of this patent is extended or adjusted under 35 U.S.C. 154(b) by 88 days.

(21) Appl. No.: 11/364,047

(22) Filed: Feb. 28, 2006

(65) Prior Publication Data

US 2007/0200206 A1    Aug. 30, 2007

(51) Int. Cl.
*H01L 23/495*    (2006.01)
*H01L 21/66*    (2006.01)
*H01L 21/00*    (2006.01)

(52) U.S. Cl. .................. 257/666; 438/15; 438/64; 438/11; 438/123

(58) Field of Classification Search ............... 257/666, 257/672; 360/324.2, 322, 603.15; 438/111, 438/112, 113, 123, 124, 127, 15, 64, 11
See application file for complete search history.

(56) References Cited

U.S. PATENT DOCUMENTS

| | | | |
|---|---|---|---|
| 4,809,135 A | 2/1989 | Yerman | |
| 4,894,752 A | 1/1990 | Murata et al. | |
| 5,532,905 A | 7/1996 | Moore | |
| 5,710,064 A | 1/1998 | Song et al. | |
| 5,886,396 A | 3/1999 | Carney et al. | |
| 6,104,084 A | 8/2000 | Ishio et al. | |
| 6,348,726 B1 | 2/2002 | Bayan et al. | |
| 6,545,342 B1 | 4/2003 | Abbott | |
| 6,720,207 B2 | 4/2004 | Minamio et al. | |
| 6,777,265 B2 * | 8/2004 | Islam et al. | 438/111 |
| 6,864,423 B2 * | 3/2005 | Tan et al. | 174/536 |
| 2001/0039078 A1 * | 11/2001 | Schroen | 438/123 |
| 2003/0035251 A1 * | 2/2003 | Asida et al. | 360/322 |
| 2003/0168719 A1 * | 9/2003 | Cheng et al. | 257/666 |
| 2006/0170081 A1 * | 8/2006 | Gerber et al. | 257/666 |

* cited by examiner

*Primary Examiner*—Zandra V. Smith
*Assistant Examiner*—Telly D Green
(74) *Attorney, Agent, or Firm*—Charles Bergere

(57) ABSTRACT

A lead frame (10) for a semiconductor device includes a first row of terminals (12) surrounding a die receiving area (14) and a second row of terminals (16) spaced from and surrounding the first row of terminals (12). The first and second rows of terminals (12, 16) have a first height ($H_1$). The terminals (12) of the first row include a step (26) that has a greater height ($H_2$). Bond wires (36) connecting die pads (34) to the first row terminals (12) extend over the second height $H_2$ part of the terminal (12) and are attached to the first height $H_1$ part of the terminal (12). The step (26) insures that the bond wires (36) attached to the stepped terminals (12) have a high wire kink profile so that they are less susceptible to damage in later process steps.

20 Claims, 3 Drawing Sheets

MULTI-ROW LEAD FRAME

BACKGROUND OF THE INVENTION

The present invention relates to semiconductor packaging in general and more specifically to a lead frame and a method of packaging a semiconductor device using such a lead frame.

Wire bonding is widely used in semiconductor packaging to provide electrical connection between an integrated circuit (IC) die and a lead frame. In wire bonding applications, wire loops are formed between the die pads of an IC die and the lead fingers of a lead frame. Typically, first wire bonds are formed on respective ones of the die pads, and second wire bonds are formed on the corresponding terminals. Wire loops with a steep angle of approach to the second wire bond are required in certain applications, for example, to prevent damage during a singulating operation to separate the lead fingers from the die receiving area of the lead frame. Such loop profiles are created by forming a high tail kink in the bond wire, that is, a bend in the tail end of the bond wire at a substantial vertical spacing from the second wire bond. However, because the bond wire is less rigid further away from the first wire bond, it is difficult to shape the tail end of the bond wire. Hence, the loop profiles of bond wires with tail kinks are often inconsistent. The tail kink is sometimes formed too low and the corresponding wire loop is susceptible to damage during subsequent packaging steps.

In view of the foregoing, it is desirable to form a wire bonded semiconductor device with consistent loop profiles. More particularly, it is desirable to form a semiconductor device wherein the bond wires have tail kinks formed at a predetermined height.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE PREFERRED EMBODIMENTS

Figure 1:
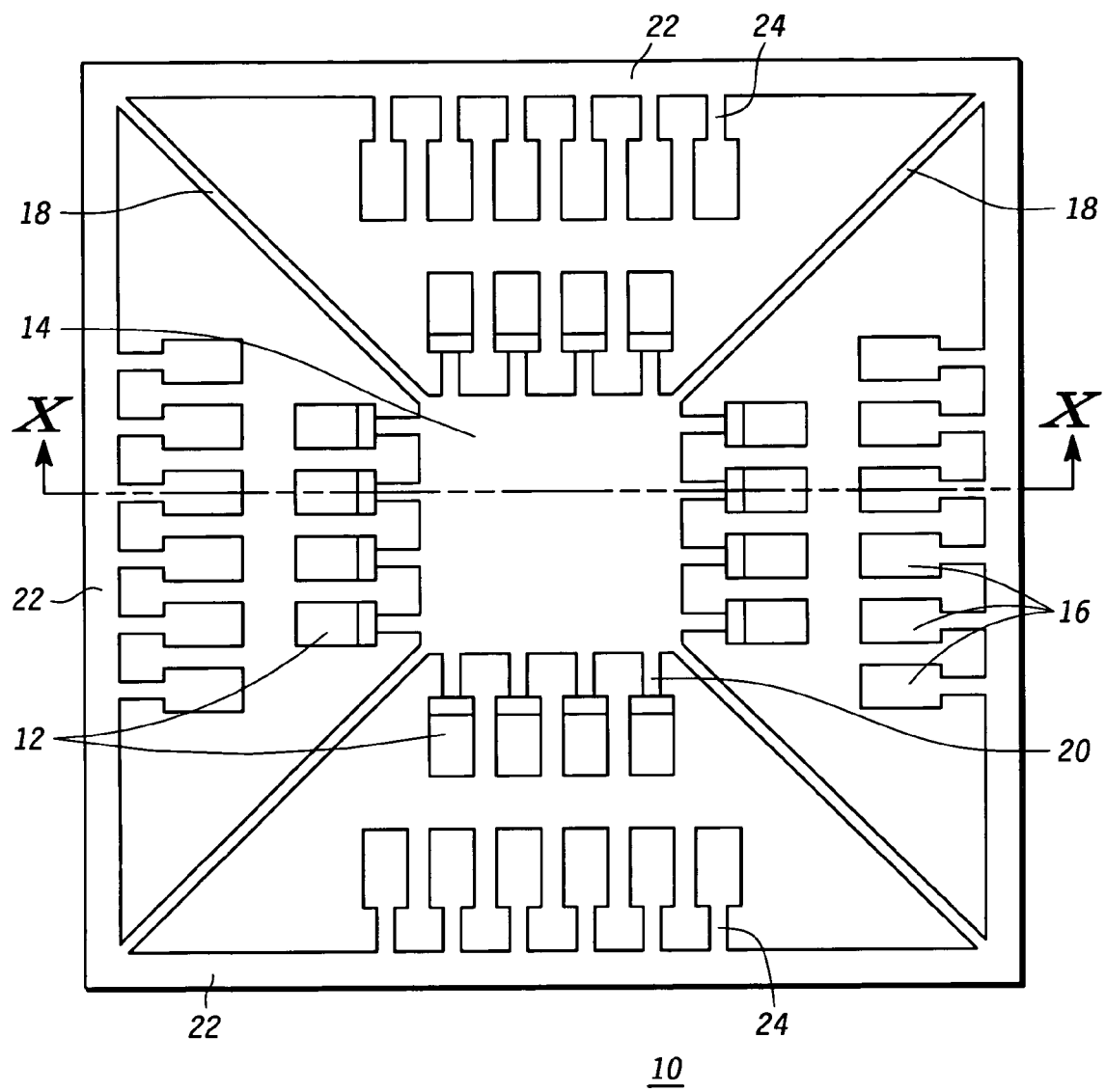
FIG. 1 is an enlarged top plan view of a lead frame in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

Certain features in the drawings have been enlarged for ease of illustration and the drawings and the elements thereof are not necessarily in proper proportion. Further, the invention is shown embodied in a quad flat no-lead (QFN) type package. However, those of ordinary skill in the art will readily understand the details of the invention and that the invention is applicable to other package types. In the drawings, like numerals are used to indicate like elements throughout.

In order to form a wire bonded semiconductor package with consistent looping profiles and to achieve the advantages discussed above and others, the present invention provides a lead frame for a semiconductor device. The lead frame includes a first row of terminals surrounding a die receiving area and a second row of terminals spaced from and surrounding the first row of terminals. The first and second rows of terminals have a first height. The terminals of the first row include a step such that the terminals of the first row also have a second height.

The present invention also provides a semiconductor device including a die receiving area, a first row of terminals surrounding the die receiving area, and a second row of terminals spaced from and surrounding the first row of terminals. The first and second rows of terminals have a first height. The terminals of the first row include a step such that the terminals of the first row have a first height part and a second height part. An integrated circuit (IC) die is attached to the die receiving area. The die includes a plurality of die pads. A plurality of wires is electrically connected to respective ones of the terminals of the first and second rows of terminals and the die pads. The wires connected to the terminals of the first row are connected to the first height part and extend over the second height part. The second height part ensures that the wires have a high last kink profile.

The present invention further provides a method of packaging a semiconductor device, including the step of forming a lead frame having a die receiving area, a first row of terminals surrounding the die receiving area, and a second row of terminals spaced from and surrounding the first row of terminals. The first and second rows of terminals have a first height. The terminals of the first row include a step such that the terminals of the first row also have a second height. An integrated circuit (IC) die is attached to the die receiving area of the lead frame. The die includes a plurality of die pads. The terminals of the first and second rows of terminals are electrically connected to respective ones of the die pads with a plurality of wires. The die, the wires and the first and second rows of terminals are encapsulated with an encapsulant such that at least a bottom surface of the first and second rows of terminals is exposed. The first row of terminals is separated from the die receiving area such as with a saw. The stepped terminal ensures that the wires connected thereto have a high last kink profile such that they are not cut or nicked by the saw.

FIGS. 1 to 4 illustrate a method of packaging a semiconductor device in accordance with an embodiment of the present invention.

Referring now to FIG. 1, a lead frame 10 having a first, internal row of terminals 12 spaced from and surrounding a die receiving area 14, and a second, external row of terminals 16 spaced from and surrounding the first row of terminals 12 is shown. The die receiving area 14 is sized and shaped to receive an integrated circuit (IC) die. As known by those of skill in the art, the size of the die receiving area varies depending on the size of the die. One typical die size is 5 mm×5 mm. The die receiving area 14 is generally square shaped, although it can have other shapes depending on the shape of the die. In this particular embodiment, each of the corners of the die receiving area 14 is connected to a corresponding corner of the lead frame 10 via respective ones of a plurality of tie bars 18. The terminals 12 of the first row are connected to and extend outwardly away from the die receiving area 14 with first connection bars 20, while the terminals 16 of the second row extend inwardly (towards the die receiving area 14) from the sides 22 of the lead frame 10 with second connection bars 24.

Figure 2:
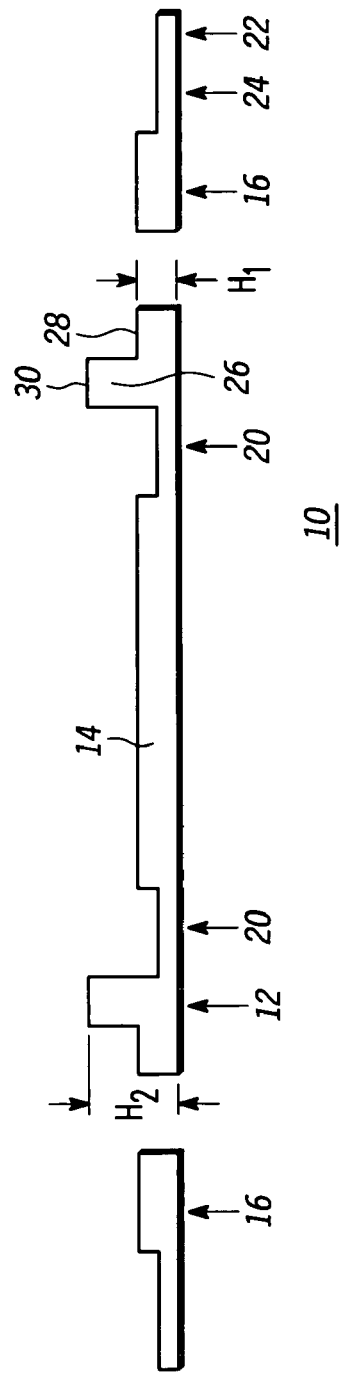
FIG. 2 is an enlarged cross-sectional view of the lead frame of FIG. 1 along a line X-X.

Referring now to FIG. 2, an enlarged cross-sectional view of the lead frame 10 of FIG. 1 along a line X-X is shown. As can be seen, the first and second rows of terminals 12 and 16 have a first height $H_1$. In addition, the terminals 12 of the first row include a step 26 such that the terminals 12 of the first row have a first height $H_1$ part 28 and a second height $H_2$ part 30. The second height $H_2$ is about two times the first height $H_1$. The second height $H_2$ is preferably at least about 8 mils. In one embodiment of the invention, the second height $H_2$ is 10 mils and the first height $H_1$ is 5 mils. Nonetheless, those of skill in the art will understand that the present invention is not limited by the heights $H_1$ and $H_2$ of the terminals 12 and 16 of the first and second.

The step 26 in the lead frame 10 may be formed using a half-etch process. More particularly, the first row of terminals 12 is initially formed to have a uniform shape (e.g., rectangular) with a height of $H_2$. Then, the terminals 12 are etched, for example, using a known etching process, to form a step, with the lower step part or first height $H_1$ part 28 (i.e., the etched part) being distal to the die receiving area 14 and the second height $H_2$ part 30 being proximal to the die receiving area 14. However, as will be understood by those of skill in the art, the step 26 may be formed in other ways. For example, if the first row terminals 12 initially have a uniform height of $H_1$, then the step may be formed by building up that portion of the terminals 12 that is closest to or proximate to the die receiving area 14, such as with a polyimide tape or an epoxy resin. The step 26 could also be formed using a mechanical coining process. As is shown in FIG. 2, the first and second connection bars 20 and 24 and the sides 22 of the lead frame 10 may have a height that is somewhat less than the first height $H_1$.

Figure 3:
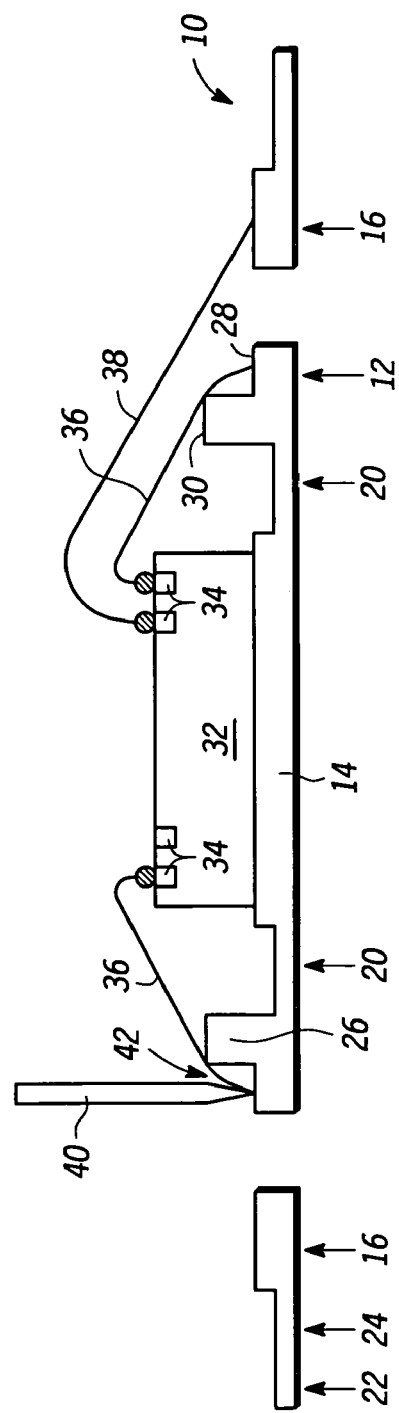
FIG. 3 is an enlarged cross-sectional view of an integrated circuit (IC) die attached to the die receiving area of the lead frame of FIG. 2.

Referring now to FIG. 3, an integrated circuit (IC) die 32 is attached to the die receiving area 14 of the lead frame 10 as shown. The die 32 may be of a type known to those of skill in the art, such as a circuit formed on and cut from a silicon wafer, and is attached to the die receiving area 14 in a known manner, such as with an adhesive material layer or an adhesive tape. The die 32 includes a plurality of die pads 34, which may be arranged in rows on top surface of the die 32 or in an array on the top surface of the die 32. Respective ones of the terminals 12 and 16 of the first and second rows of terminals and the die pads 34 are electrically connected via a plurality of wires. More particularly, first wires 36 are used to electrically connect predetermined ones of the die pads 34 to the first row terminals 12 and second wires 38 are used to electrically connect predetermined other ones of the die pads 34 to the second row terminals 16. The first and second wires 36 and 38 are connected to the die pads 34 and the first and second rows of terminals 12 and 16 with a wire bonding tool 40 such as, for example, a capillary, as is known in the art. The first and second wires 36 and 38 may be made of gold (Au), copper (Cu), aluminum (Al) or other electrically conductive materials as are known in the art and commercially available.

As can be seen from FIG. 3, the step 26 is used to form a tail kink 42 in the first wires 36 connecting the die pads 34 to the first row terminals 12. More particularly, the first wires 36 are connected to the die pads 34 and then to the first height $H_1$ part 28 of the first row terminals 12 such that the first wires 36 extend over the second height $H_2$ part 30, which causes the first wires 36 to have a high last kink wire profile. No additional step of shaping the tail end of the wire 36 is required. Thus, the wires 36 can be formed using a conventional wire bonding process. Further, because the step 26 has a predetermined height $H_2$, the tail kinks 42 are formed at a substantially constant vertical spacing from the second wire bond. Consequently, all the first wires 36 connecting the die pads 34 to the first row terminals 12 have a consistent loop profile. By acting as a support platform, the step 26 helps to prevent wire sweep during a subsequent encapsulation process, described below.

Figure 4:
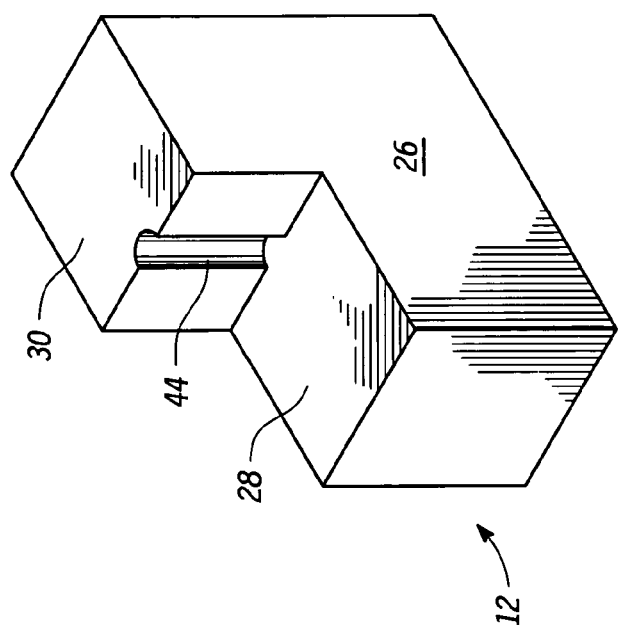
FIG. 4 is an enlarged perspective view of one embodiment of a lead frame terminal in accordance with the present invention.

Referring to FIG. 4, a groove 44 may be formed in the step 26. The groove 44 extends from the top surface of the second height $H_2$ part 30 towards the first height $H_1$ part 28 to which the first wire is attached. As the first wires 36 fit in the grooves 44, the first wires 36 connecting the die 32 to the first row terminals 12 are thus prevented from lateral movement during the encapsulation process, thereby preventing wire sweep.

Figure 5:
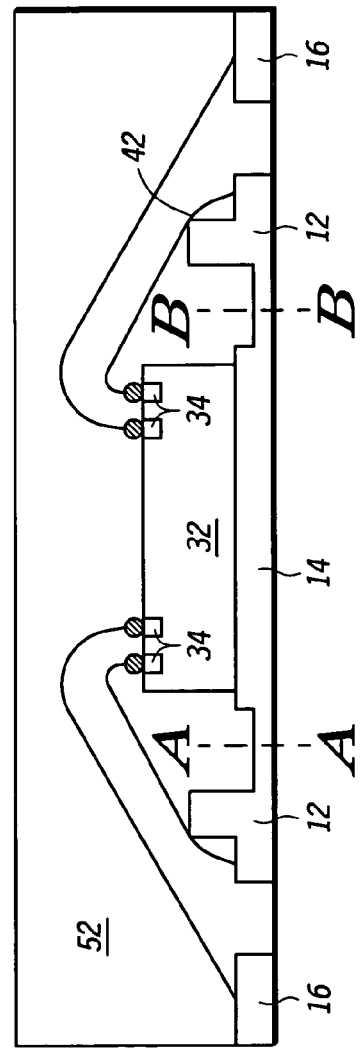
FIG. 5 is an enlarged cross-sectional view of the die and a portion of the lead frame of FIG. 3 encapsulated with a mold compound.

Referring now to FIG. 5, a cross-sectional view of an almost complete QFN package 50 is shown. The QFN package 50 includes the die 32 attached to the die receiving area 14, and the first and second wires 36 and 38 electrically connecting die pads 34 with the terminals of the first and second rows 12 and 16. The die 32, the first and second wires 36 and 38, and at least a top surface of the lead frame have been covered with an encapsulant or mold compound 52. A molding operation such as, for example, an injection molding process is used to perform the encapsulation, as is known in the art. The encapsulant 52 may comprise well known commercially available molding materials such as plastic or epoxy. The sides 22 and second connection bars 24 have been trimmed, such as by saw singulation, from the lead frame 10 such that the second row terminals 16 are exposed at a bottom and side thereof.

Another singulating operation is performed to separate the first row of terminals 12 from the die receiving area 14. In this particular embodiment, the first row of terminals 12 is separated from the die receiving area 14 by performing a depth controlled cut along lines A-A and B-B with a saw such as, for example, a dicing saw. The first wires 36 connecting the die pads 34 to the first row terminals 12 are prevented from damage or severance by the saw blade during the singulating operation because first wire 36 has a high last kink wire profile 42, which ensures that sufficient clearance is maintained between each of the first wires 36 and the saw blade during the singulating operation.

Thus, as will be understood, the present invention provides a method of packaging a semiconductor device, including the steps of forming a lead frame having a die receiving area, a first row of terminals surrounding the die receiving area, and a second row of terminals spaced from and surrounding the first row of terminals, wherein the first and second rows of terminals have a first height, and the terminals of the first row include a step such that the terminals of the first row also have a second height, and attaching an integrated circuit (IC) die to the die receiving area of the lead frame and then electrically connecting die pads on the IC die to the terminals of the first and second rows of terminals with a plurality of wires, and finally encapsulating the die, the wires and the first and second rows of terminals with an encapsulant, wherein at least a bottom surface of the first and second rows of terminals is exposed. The first row of terminals is separated from the die receiving area, such as by sawing with a depth controlled cut. The wires connected to the terminals of the first row of terminals are attached to the lower (first height) part of the step, and the second height part of the step ensures that the wires have a high last kink so that the wires will not be cut or nicked by the saw. In an alternate embodiment, each of the steps includes a groove into which the wire fits in order to limit wire sweep problems.

As is evident from the foregoing discussion, the present invention provides a lead frame and a method of packaging a semiconductor device using the lead frame, which has benefits over existing products and processes. For example, by forming a step on the first (internal) row of terminals, the present invention ensures that tail kinks are consistently formed at a predetermined height in the bonding wires, thereby preventing wire damage during the packaging process. Additionally, the tail kinks can be formed using a conventional wire bonding process. Further, as the step functions as a support platform, wire sweep during a subsequent encapsulation process is prevented.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, the present invention may be implemented on a panel of lead frames. Further, a lead frame having more than two rows of terminals could be formed in which either one or more of the inner rows are stepped. It is understood, therefore, that this invention is not limited to the particular embodiments disclosed, but covers modifications within the spirit and scope of the present invention as defined by the appended claims.

The invention claimed is:

1. A multi-row lead frame for a semiconductor device, comprising:
   a die receiving area for receiving a semiconductor integrated circuit (IC) die;
   a first row of terminals spaced from and surrounding the die receiving area; and
   a second row of terminals spaced from and surrounding the first row of terminals, wherein the first and second rows of terminals have a first height, and wherein the terminals of the first row include a step such that the terminals of the first row also have a second height.

2. The multi-row lead frame of claim 1, wherein the step provides support for wires connecting a die on the die receiving area to the terminals of the first row to ensure that said wires have a high last kink wire profile.

3. The multi-row lead frame of claim 1, wherein a groove is formed in the step.

4. The multi-row lead frame of claim 1, wherein the second height is about two times the first height.

5. The multi-row lead frame of claim 4, wherein the second height is at least about 8 mils.

6. The multi-row lead frame of claim 4, wherein the first height is about 5 mils.

7. The multi-row lead frame of claim 1, wherein the step is formed with a half-etch process.

8. The multi-row lead frame of claim 1, wherein the step is formed with a coining process.

9. The multi-row lead frame of claim 1, wherein the step is formed by dispensing an epoxy on at least a portion of a top surface of the first row of terminals and curing said epoxy.

10. The multi-row lead frame of claim 1, wherein the step is formed by attaching a polyimide tape on at least a portion of a top surface of the first row, of terminals.

11. A semiconductor device, comprising:
   a die receiving area;
   a first row of terminals spaced from and surrounding the die receiving area;
   a second row of terminals spaced from and surrounding the first row of terminals, wherein the first and second rows of terminals have a first height, and wherein the terminals of the first row include a step such that the terminals of the first row have a first height part and a second height part;
   an integrated circuit (IC) die attached to the die receiving area, the IC die including a plurality of die pads; and
   a plurality of wires electrically connected to respective ones of the terminals of the first and second rows of terminals and the die pads, wherein the wires connected to the terminals of the first row are bonded to the first height part and the second height part ensures that the wires connected to the terminals of the first row have a high last kink wire profile.

12. The semiconductor device of claim 11, further comprising an encapsulant covering the die, the wires and the first and second rows of terminals, wherein at least a bottom surface of the first and second rows of terminals is exposed.

13. The semiconductor device of claim 12, wherein a groove is formed in the step.

14. The semiconductor device of claim 11, wherein the second height is about two times the first height.

15. The semiconductor device of claim 14, wherein the second height is at least about 8 mils.

16. A multi-row lead frame for a semiconductor device, comprising:
   a die pad for receiving an integrated circuit die;
   a first row of terminals spaced from and surrounding the die pad, wherein the terminals of the first row are connected to the die pad with respective connection bars; and
   a second row of terminals spaced from and surrounding the first row of terminals, wherein the first and second rows of terminals have a first height, and wherein the terminals of the first row include a step such that the terminals of the first row have a first height part distal to the die pad and a second height part proximal to the die pad.

17. The multi-row lead frame of claim 16, wherein each of the steps of the first row of terminals include a groove formed in the second height part proximate to the first height part.

18. The multi-row lead frame of claim 16, wherein the lead frame is formed of copper and the steps are formed via an etching process.

19. The multi-row lead frame of claim 16, wherein the second height is about twice the first height.

20. The multi-row lead frame of claim 16, wherein the first height is about 5 mils and the second height is about 10 mils.

* * * * *